United States Patent [19]

Hower et al.

[11] 4,112,362

[45] Sep. 5, 1978

[54] METHOD FOR THE NONDESTRUCTIVE TESTING OF VOLTAGE LIMITING BLOCKS

[75] Inventors: Philip L. Hower, Pittsburg; William G. Carlson, Murrysville; Tapan K. Gupta, Monroeville, all of Pa.

[73] Assignee: Electric Power Research Institute, Inc., Palo Alto, Calif.

[21] Appl. No.: 755,619

[22] Filed: Dec. 30, 1976

[51] Int. Cl.² .................................................. G01R 31/02
[52] U.S. Cl. .................................. 324/158 R; 324/72; 324/158 D
[58] Field of Search ................... 324/28 R, 72, 158 D, 324/65 P, 158 R

[56] References Cited

U.S. PATENT DOCUMENTS 2,776,402  1/1957  Kokesh ........................... 324/65 P
3,090,112  5/1963  Smith ................................ 324/72

Primary Examiner—Rudolph V. Rolinec
Assistant Examiner—Ernest F. Karlsen
Attorney, Agent, or Firm—Flehr, Hohbach, Test, Albritton & Herbert

[57] ABSTRACT

A method for the nondestructive testing of voltage limiting blocks includes the steps of providing several discrete electrical contacts across the block, sequentially applying to each of the contacts a voltage to determine the corresponding current and utilizing the current and voltage values to determine constants related to the microstructure of that particular location. The constants can then be utilized to derive a contour map which will be indicative of a hot spot in such block as determined by a maxima of the contour map.

3 Claims, 4 Drawing Figures

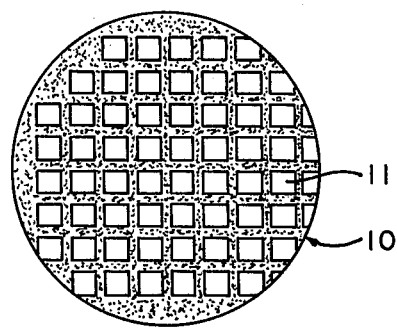
FIG.—1
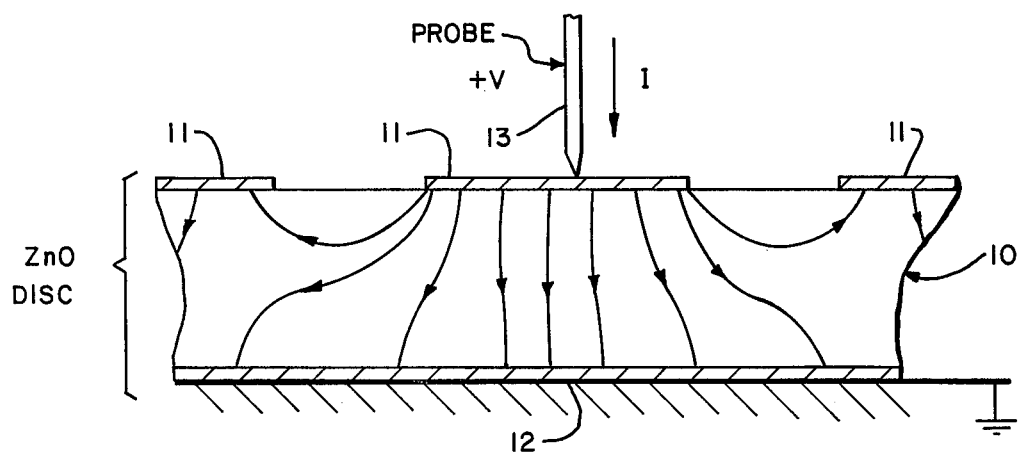
FIG.—2
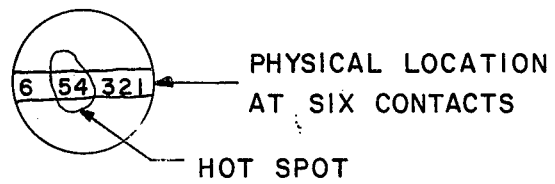
FIG.—3A

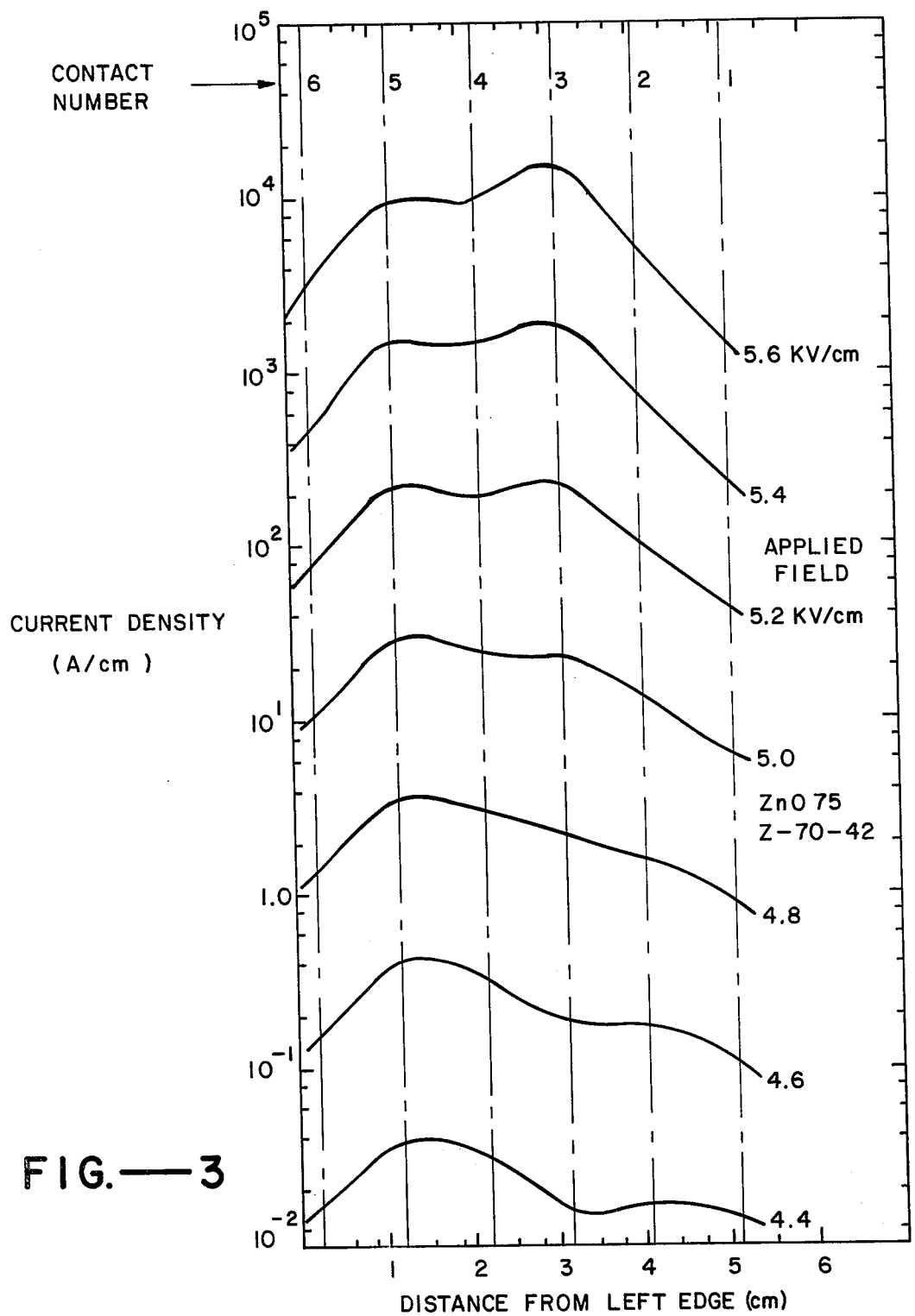
FIG.—3
CALCULATED CURRENT DENSITY, Iij,
FOR DIFFERENT APPLIED FIELDS, Vij/(BLOCK THICKNESS)

METHOD FOR THE NONDESTRUCTIVE TESTING OF VOLTAGE LIMITING BLOCKS

BACKGROUND OF THE INVENTION

The present invention is directed to a method for the nondestructive testing of voltage limiting blocks and more particularly to determining the energy absorption capability of the block without destroying it.

Voltage limiting blocks, which are for example disk shaped and for many commercial applications 5 centimeters or more in diameter, are used in the commerical power field as lightning or surge arresters, for example, to protect large and expensive power transformers. A number of blocks are stacked together either in series or parallel. Ten to 20 blocks may offer a voltage protection of, for example, 35 to 50 kilovolts. The voltage limiting blocks are generally composed of zinc oxide doped with other metal oxides and are formed by sintering.

The problem in the prior art has been that of hot spots; i.e., locations of higher current density and therefore higher local temperatures. The existence of these hot spots has been recognized and that they were due to non-uniformities in the microstructure of the block itself. However, the only solution was to provide an energy absorption rating for a particular production run of blocks with a very large safety factor. The overall absorption rating, for example, in terms of joules per cubic centimeter was obtained only after the destructive testing of what was believed to be a representative sampling of the production run.

However, since at the present time the cause of nonuniformities or hot spots in voltage limiting blocks is not known the assumption that a few samples taken from a production run are representative of the remaining production run is very weak. Thus a large safety factor is necessary which in its commercial format means the cross-sectional area must be increased or more parallel stacks must be provided.

OBJECTS AND SUMMARY OF THE INVENTION

It is, therefore, a general object of the present invention to provide an improved method for the testing of voltage limiting blocks.

It is another object of the invention to provide a nondestructive method of testing voltage limiting blocks where every block in a production run can be tested and sorted as to quality rating.

It is another object of the invention to provide a method as above which accurately locates hot spots or areas of nonuniformity in a block.

In accordance with the above objects there is provided a method for the nondestructive testing of voltage limiting blocks. A plurality of discrete electrical contacts are placed on one surface of a block and a full electrode on the opposite side. A voltage is sequentially applied to each contact and the resultant current measured. Empirical constants are derived from the voltage and current representative of the particular microstructure of the block in proximity to a respective contact. The derived constants are utilized to effectively draw a contour map across the block of current density. The maxima of the contour permits the calculation of a quality rating of the block.

BRIEF DESCRIPTION OF THE DRAWINGS

FIG. 1 is an elevation view of a block used in the method of the present invention;

FIG. 2 is an enlarged cross sectional view of a portion of FIG. 1;

FIG. 3 is a family of curves useful in understanding the present invention; and

FIG. 3A is a simplified elevational view of a block used in conjunction with FIG. 3.

DETAILED DESCRIPTION OF THE PREFERRED EMBODIMENT

FIG. 1 shows an elevation view of a completed zinc oxide voltage limiting block 10 which is approximately 5 centimeters in diameter and which has deposited on it approximately 58 metallic electrodes 11 which are distributed substantially evenly across the surface. As illustrated in FIG. 2 the bottom surface of the block 10 has a full area electrode 12. A voltage is sequentially applied to each contact 11 by means of probe 13 and apparatus (not shown) is provided for measuring the resultant current. The approximate current distribution is shown by the lines in block 10 from the top contacts 11 to the bottom contact 12.

In general it is desired that the contact grid made up of contacts 11 should localize the current as much as possible so that each measurement is representative of the particular microstructure of the block in proximity to a contact.

The current voltage characteristics of a voltage limiting block is such that the current is proportional to applied voltage in an exponential relationship. More specifically, the current voltage characteristics of the voltage limiter may be expressed as $$I_{ij} = K_{ij} V^{\alpha ij} \qquad (1)$$

where $ij$ represents the coordinates of a particular location or contact of the block, $\alpha$ and $K$ are constants representing the microstructure of that particular coordinate of the block and $V$ is applied voltage and $I_{ij}$ is the current density.

In general, the method involves the steps of applying a voltage to each contact and measuring the resultant current and determining the $\alpha_{ij}$ and $K_{ij}$ for that contact. Thereafter, these derived constants of $\alpha$ and $K$ can be used to effectively draw a contour map across the block representative of current $I_{ij}$, where the maxima of the contour map will be potential hot spots or points of nonuniformity. Thereafter the current density maxima can be converted to, for example, jourles per cubic centimeter which is a typical quality rating of energy absorption capability.

To explain the above current density to temperature conversion an applied voltage surge or pulse of, for example, 5 milliseconds pulse width can be assumed. It is then known that the energy of the pulse is the voltage and current multiplied by the pulse time. Such energy must be absorbed by the mass of that particular location in the block which has a certain specific heat and a certain maximum permissible temperature rise, $\Delta T$. For example, it is known from experimental work on small diameter (1 cm) blocks that surge testing to a temperature of approximately 210° C. leads to device failure. In this case $\Delta T$ is 185° C., corresponding to the initial block temperature of 25° C. Since mass is related to density, (i.e., the product of density and volume) and volume in turn is related to thickness and area, area can be divided on both sides of the foregoing relationship to provide a fixed relationship between current density, that is, current/area and ΔT. Thus for a given pulse length and applied field there will be a critical value of current density $J_{crit}$ corresponding to ΔT. For example, assume the breakdown field is 2 kV/cm, then for a pulse time of 5 milliseconds, $J_{crit}$ is equal to 46 A/cm². By computing contour maps for increasing applied voltages, it is possible to determine the critical voltage for which the maximum contour is equal to $J_{max}$. The resulting terminal current can be found by integrating the current density over the disk, thereby giving a maximum applied energy, which can be used as a quality rating.

The following example illustrated in conjunction with FIG. 2 shows the method of the foregoing invention.

FIG. 3A shows a block approximately 5 centimeters in diameter with six contacts designated 1 through 6 across the diameter of the block. Their relative physical location is illustrated. In the headings of six columns in FIG. 3 the six contacts are indicated with their contact number and the cross-hatched associated portions indicates the relative size of the contact. Each $a_i$ and $K_i$ (since there is only a single coordinate) is determined by use of equation (1) and three voltage-current data points. In other words, three different voltages are applied to each contact point. The $a$, K constants are then determined by at least squares fit to (1) for each point.

Thereafter the curves of FIG. 3 are derived assuming the various applied voltage fields of from 4.4 kilovolts per centimeter to 5.6 kilovolts per centimeter. These voltages are substituted in equation (1) and the resultant two dimensional contours obtained. These are the calculated or predicted current densities for different applied voltages or field. With a field of 5.2 kilovolts per centimeter a hot spot occurs approximately between contacts 4 and 5. This was confirmed as illustrated in FIG. 3A by coating the surface of the disk with a liquid crystal substance which has a color change in accordance with temperature. The hot spot with that applied field was found to occur at the point shown in FIG. 3A to confirm the foregoing theory.

FIG. 3 also shows that when the applied voltage is increased to a higher value the hotspot shifts as shown by the maxima of the contour curves near contact 3. This illustrates that valuable quality information concerning a voltage limiting block can be obtained by relatively simple nondestructive testing.

In actual commercial practice the two dimensional contact grid such as of FIG. 1 would be utilized by the use of, for example, computer techniques and a three dimensional contour map prepared in order to find the maxima of current density and thereafter a suitable quality rating would be applied to that disk. The contacts 11 then would, of course, be eliminated from the block and a full contact provided for actual commercial use.

Thus, an improved method for nondestructive testing of voltage limiting blocks has been provided where the energy absorption capability can be easily determined without destroying the block. Moreover, the specific hot spot location can be determined which will permit further examination of the block by metallurgical techniques. Finally, the present method is adaptable to automatic testing for production selection of blocks.

What is claimed is:

1. A method for the nondestructive testing of voltage limiting blocks comprising the following steps: placing a plurality of discrete electrical contacts on one surface of a block and a full electrode on the opposite surface of the block; sequentially applying a voltage to each contact and measuring the resultant current; deriving from said voltage and current empirical constants representative of the particular microstructure of said block in proximity to a respective contact; utilizing said derived constants to effectively draw a contour map of current density across said block; and determining the maxima of said contour to permit the calculation of a quality rating of said block.

2. A method as in claim 1 where in said contour map step an assumed operating voltage is also utilized.

3. A method as in claim 2 where said quality rating is change of temperature given an assumed voltage pulse time.

* * * * *